United States Patent
Sumi

(10) Patent No.: US 7,206,011 B2
(45) Date of Patent: Apr. 17, 2007

(54) APPARATUS FOR AND METHOD OF RECORDING OPTICALLY SCANNED IMAGE

(75) Inventor: Katsuto Sumi, Minamiashigara (JP)

(73) Assignee: Fujifilm Corporation, Tokyo (JP)

( * ) Notice: Subject to any disclaimer, the term of this patent is extended or adjusted under 35 U.S.C. 154(b) by 799 days.

(21) Appl. No.: 10/114,125

(22) Filed: Apr. 3, 2002

(65) Prior Publication Data

US 2002/0149807 A1 Oct. 17, 2002

(30) Foreign Application Priority Data

Apr. 16, 2001 (JP) .............................. 2001-117199

(51) Int. Cl.
*B41J 2/47* (2006.01)
(52) U.S. Cl. .................. 347/225; 347/232; 347/233; 347/234; 347/235; 347/248; 347/252; 347/253; 347/255; 358/2.1; 358/506; 358/510
(58) Field of Classification Search ............... 358/1.2, 358/451, 494, 298, 2.1, 506, 510; 347/225, 347/232, 233, 234, 235, 248, 252, 253, 255
See application file for complete search history.

(56) References Cited

U.S. PATENT DOCUMENTS

| 5,687,002 A * | 11/1997 | Itoh ............................ 347/133 |
| 5,934,195 A * | 8/1999 | Rinke et al. .............. 101/401.1 |
| 2004/0125118 A1* | 7/2004 | Raunkjaer et al. .......... 345/700 |

FOREIGN PATENT DOCUMENTS

JP 2000-35673 2/2000

* cited by examiner

*Primary Examiner*—King Y. Poon
*Assistant Examiner*—Vu B. Hang
(74) *Attorney, Agent, or Firm*—Sughrue Mion, PLLC

(57) ABSTRACT

An image signal with an overshoot is generated on a positive-going edge of an input image signal with an overshoot producing unit. Then, a light signal with an overshoot is outputted from a recording light source in response to the image signal with the overshoot supplied from the overshoot producing unit. The light signal outputted from the recording light source is applied to scan a photosensitive medium to record an area gradation image on the photosensitive medium.

18 Claims, 9 Drawing Sheets

APPARATUS FOR AND METHOD OF RECORDING OPTICALLY SCANNED IMAGE

BACKGROUND OF THE INVENTION

1. Field of the Invention

The present invention relates to an apparatus for and a method of recording an image on a photosensitive medium by exposing the photosensitive medium to a light signal by scanning the photosensitive medium with the light signal, and more particularly to an apparatus for and a method of recording an image with a light signal on a photopolymer plate for use in printing applications.

2. Description of the Related Art

There are known optical scanning image recording apparatus for recording an area gradation image with a light signal on a photosensitive medium such as a photographic film according to a scanning exposure process. In such optical scanning image recording apparatus, the exposure power or exposure energy density of the light signal is recorded on the photosensitive medium at a certain constant magnitude regardless of the size of the image recorded on the photosensitive medium.

With the exposure output recorded at the constant magnitude, however, depending on the photosensitivity characteristics of the photosensitive medium, a desired image density may not be achieved, i.e., a highlight jump may occur, when a small image of several pixels making up a highlight halftone dot is recorded on the photosensitive medium.

Photosensitive printing plate mediums such as photopolymer plates also suffer a problem in that their desired wear resistance cannot be obtained when they record small images by exposure to light.

One solution to the above problems is to increase the exposure power of a light signal for recording the image on a photosensitive medium such as a photosensitive printing plate medium with a higher amount of exposure to light, i.e., a higher amount of recording light. The increased exposure power of the light signal is effective in increasing the wear resistance of the photosensitive medium, but tends to cause other problems of poor image quality including greater image irregularities in a large screen tint image due to an excessive amount of exposure to light, blurs on halftone dot edges, and increases in the width of thin lines.

SUMMARY OF THE INVENTION

It is therefore an object of the present invention to provide an apparatus for and a method of recording an optically scanned image by appropriately controlling the intensity of a light signal to achieve both a desired image density or plate wear resistance and a high level of image quality even when small images are recorded.

Another object of the present invention is to provide an apparatus for and a method of recording an optically scanned image on a photosensitive medium which has a photosensitive layer disposed on a support base and having portions turned into an image upon exposure to light, to achieve a sufficient level of plate wear resistance at highlight areas of the image recorded on the photosensitive medium and also to suppress the generation of image irregularities in the image.

Still another object of the present invention is to provide an apparatus for and a method of recording an optically scanned image on a photopolymer plate for printing applications by controlling an amount of exposure to light in view of photosensitive characteristics of the photopolymer plate thereby to achieve an optimum level of image quality and printing quality.

According to the present invention, in an apparatus for and a method of recording an area gradation image on a photosensitive medium by scanning the photosensitive medium with a light signal, an image signal with an overshoot is generated on a positive-going edge of an input image signal with an overshoot producing means, and a light signal with an overshoot is outputted from a recording light source in response to the image signal with the overshoot supplied from the overshoot producing means.

In the present invention, the light signal with the overshoot generated on the positive-going edge by the overshoot producing means is applied to scan the photosensitive medium by the recording light source to record an area gradation image on the photosensitive medium. Therefore, even when a small image is recorded on the photosensitive medium, a desired image density or a desired level of plate wear resistance can be achieved by the overshoot. When a large image is recorded, the photosensitive medium is scanned primarily by a flat portion of the light signal after the overshoot, so that the photosensitive medium is prevented from being overly scanned and the image recorded thereon has a high level of image quality.

The photosensitive medium comprises a support base and a photosensitive layer disposed on the support base and having an area capable of being turned into an image upon exposure to the light signal.

If the photosensitive medium comprises a printing plate, then the wear resistance thereof is improved. If the photosensitive medium comprises a film, then a desired image density can be achieved thereby.

The recording light source comprises a semiconductor laser. The semiconductor laser used as the recording light source allows the overshoot to be generated easily with an electric circuit.

Preferably, the overshoot has an amplitude which is at least 0.4 times the amplitude of a flat portion of the light signal.

The overshoot is preferably produced in a time duration which corresponds to a range from 10 µm to 60 µm in terms of the length of the image in a scanning direction on the photosensitive medium.

The overshoot is preferably produced in a time duration which corresponds to a range from one to six pixels in terms of the number of pixels in a scanning direction on the photosensitive medium.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
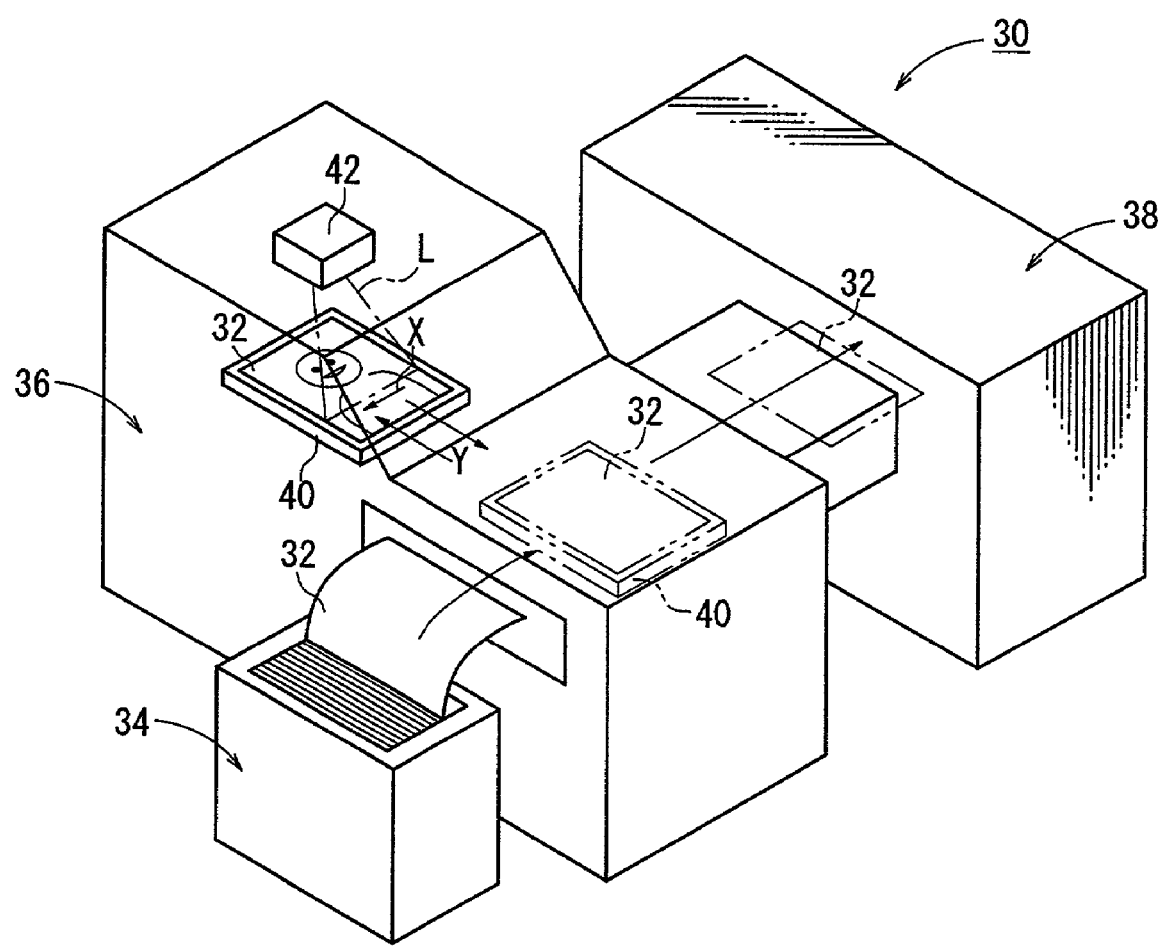
FIG. 1 is a perspective view of a printing plate producing system.

Like or corresponding parts are denoted by like or corresponding reference characters throughout views.

FIG. 1 shows in perspective a printing plate producing system 30 which incorporates an apparatus for and a method of recording an optically scanned image according to the present invention. The printing plate producing system 30 is a CTP (Computer To Plate) system for producing a printing plate on which an image for generating a printed material is recorded, directly from digital image data without using a film.

As shown in FIG. 1, the printing plate producing system 30 basically comprises a plate supplying device 34 for supplying an unexposed photosensitive medium 32, an optically scanned image recording apparatus 36 for scanning an unexposed photosensitive medium 32 with a light signal L modulated by an image signal to record an image on the photosensitive medium 32, and a developing device 38 for developing the image recorded on the photosensitive medium 32.

Figure 2:
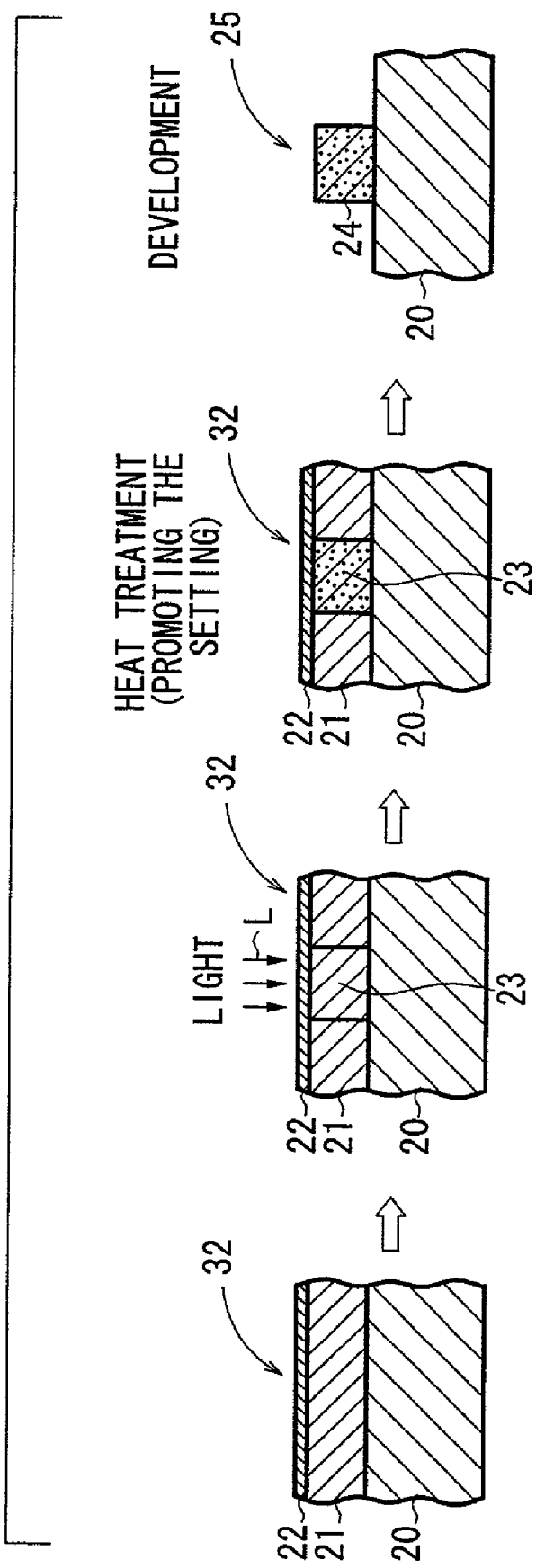
FIG. 2 is a fragmentary cross-sectional view showing a process in which an exposed area of a photosensitive medium is turned into and remains as an image.

The photosensitive medium 32 is shown fragmentarily in cross section in FIG. 2. As shown in FIG. 2, the photosensitive medium 32 comprises a photosensitive layer disposed on a support base and having an area turned into an image upon exposure to a light signal L such as a laser beam. As shown in the leftmost diagram of FIG. 2, the photosensitive medium 32 basically comprises a photosensitive layer 21 of photopolymer disposed on a support base 20 such as a metal base made of aluminum or the like and a transparent overcoat layer 22 disposed on the photosensitive layer 21 for blocking oxygen from passing therethrough. The photosensitive medium 32 thus constructed is referred to as a photopolymer plate.

As shown in the second diagram from the leftmost diagram in FIG. 2, an area 23 of the photosensitive layer 21 which is exposed to the light signal L is set. Thereafter, as shown in the third diagram from the leftmost diagram in FIG. 2, the photosensitive medium 32 is heated to promote the setting of the exposed area 23. Then, as shown in the rightmost diagram of FIG. 2, after the photosensitive medium is heated, the photosensitive medium 32 is treated in an alkaline developing liquid, and the area of the photosensitive layer 21 which has not been exposed to the light signal L is removed by a brush or the like, producing a printing plate 25 where the exposed area 23 serves as an image 24.

The photosensitive medium 32 has the photosensitive layer 21 disposed on the support base 20, where the exposed area 23 remains as the image 24. If the image 24 has not been set sufficiently, then the image 24 that serves as an isolated image or an image with a small area such as a halftone dot image in a highlight area tends to be removed while the photosensitive medium 32 is being subjected to a developing process or a printing process.

Figure 3:
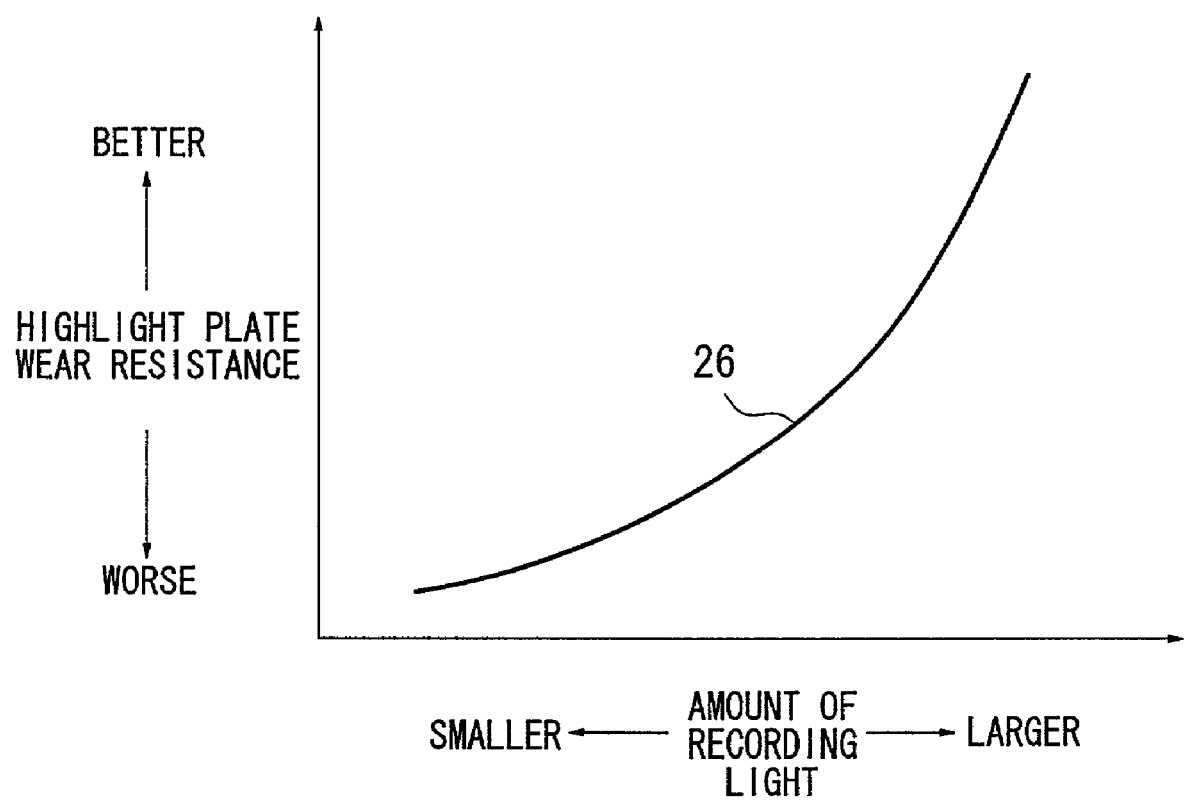
FIG. 3 is a diagram showing the plate wear resistance of the photosensitive medium.

When the above photosensitive medium 32 is scanned directly with the light signal L and forms a halftone dot image thereon by way of area modulation (area gradation), if an image of small halftone % (highlight image) is to be sufficiently formed on the photosensitive medium 32 and the plate wear resistance of such a highlight image is to be sufficiently achieved, then it is necessary to expose the photosensitive medium 32 with an increased amount of light (recording light) for the highlight image, as indicated by a qualitative characteristic curve 26 in FIG. 3.

However, simply increasing the amount of recording light joins halftone dots in a shadow image including a screen tint image and lowers the resolution of separating dots of halftone %, resulting in a problem in that a black thin line surrounded by a highlight image and a white thin line surrounded by a shadow image have different widths.

Figure 4:
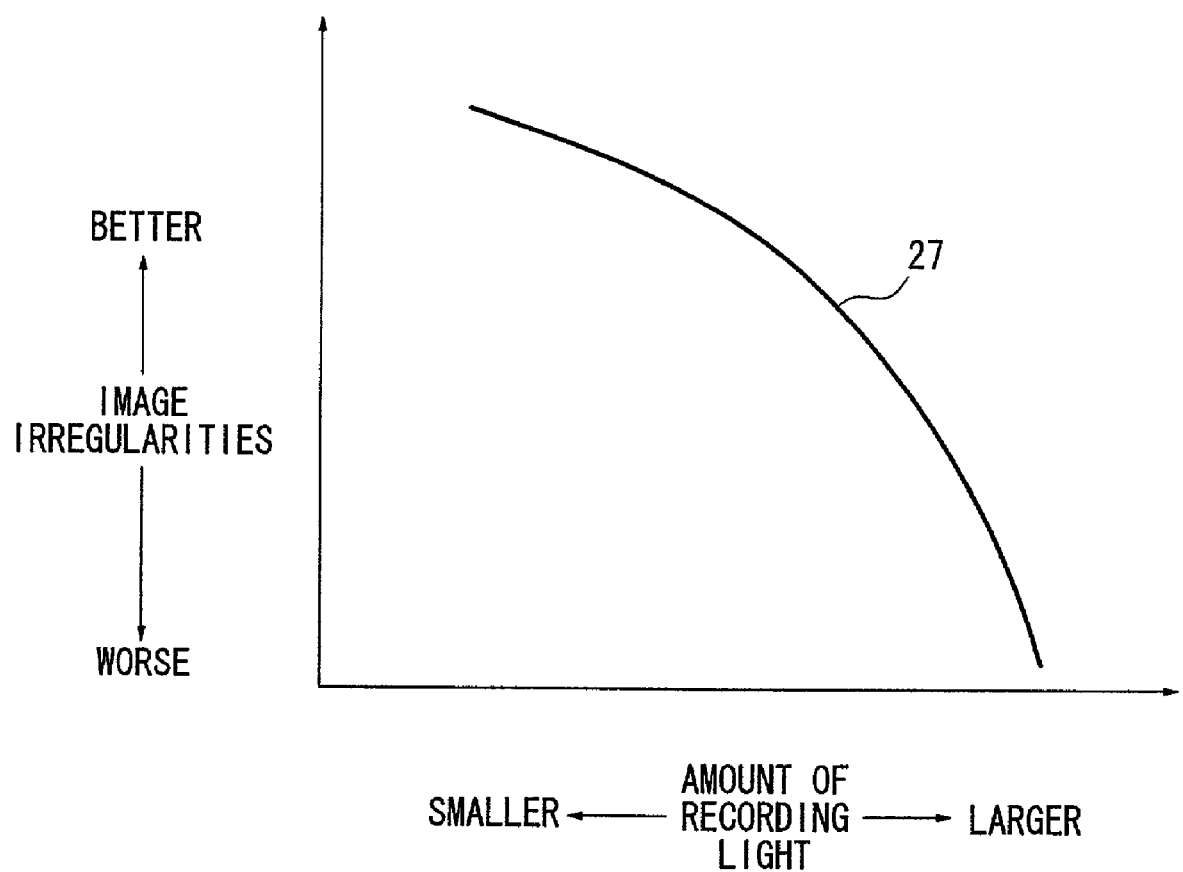
FIG. 4 is a diagram showing the image irregularity characteristics of the photosensitive medium.

Furthermore, as indicated by a qualitative characteristic curve 27 in FIG. 4, when the amount of recording light is increased, the effect of flaring light generated around the image increases, producing a fog in a non-image area which is responsible for image irregularities.

As shown in FIG. 1, the plate supplying device 34 holds a plurality of unexposed photosensitive mediums 32, each having the above properties, and supplies one at a time of the unexposed photosensitive mediums 32 to the light beam scanning device 36 in the direction indicated by the arrow.

The light beam scanning device 36 feeds the unexposed photosensitive medium 32 supplied from the plate supplying device 34 with an exposure stage 40 in an auxiliary scanning direction indicated by the arrow Y. At the same time the light beam scanning device 36 scans the unexposed photosensitive medium 32 with a laser beam L, which has been modulated by an image signal supplied from an image recording unit 42, in a main scanning direction indicated by the arrow X that is perpendicular to the auxiliary scanning direction, thereby recording a two-dimensional image, i.e., a halftone dot image, on the photosensitive medium 32 according to an area modulating process.

The developing device 38 develops the image recorded on the photosensitive medium 32 that is supplied from the image recording apparatus 36, and outputs a printing plate.

Figure 5:
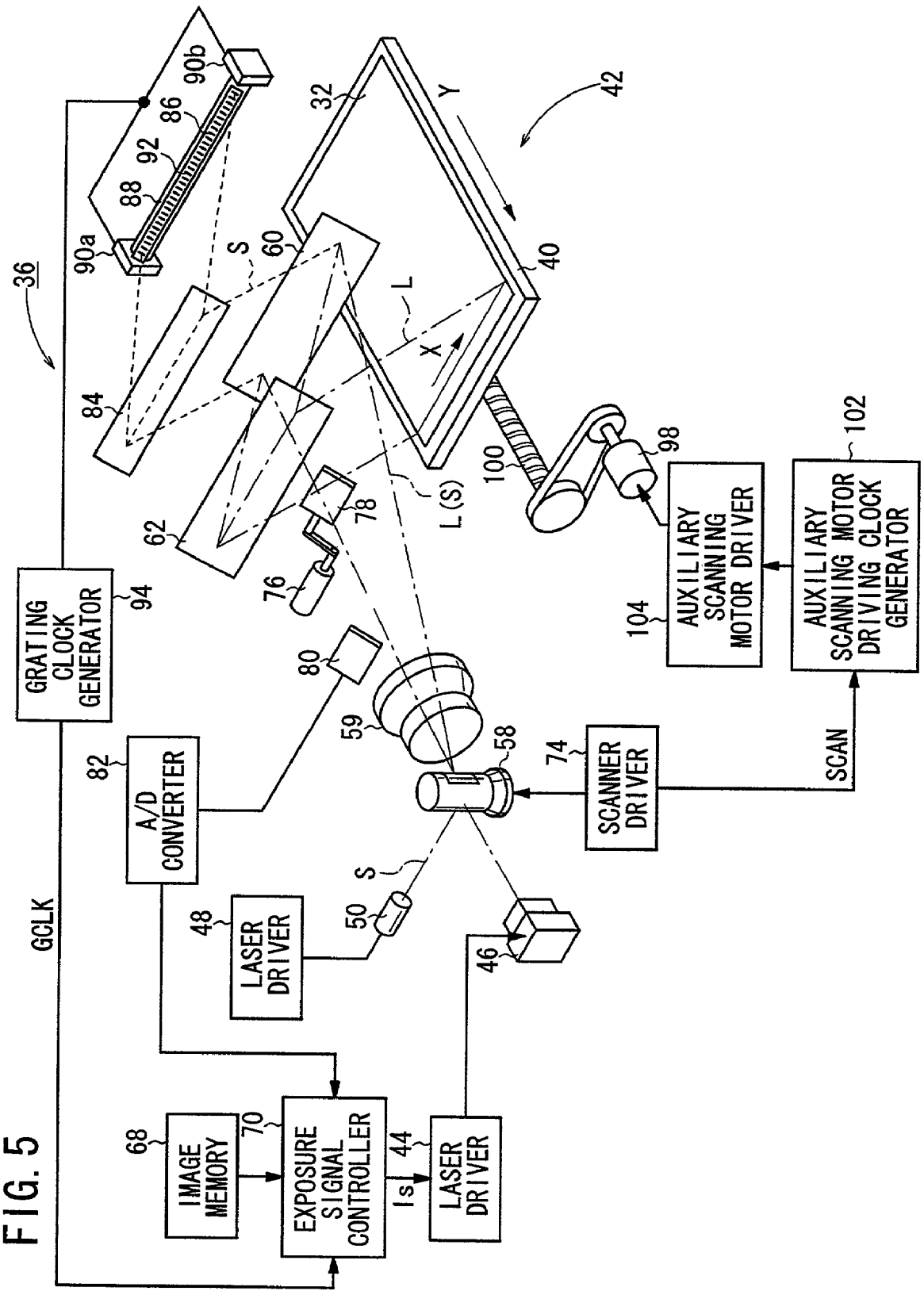
FIG. 5 is a schematic perspective view, partly in block form, of an apparatus for recording an optically scanned image of an embodiment according to the present invention.

FIG. 5 shows in perspective the optically scanned image recording apparatus 36 together with its control circuit shown in block form.

As shown in FIG. 5, the optically scanned image recording apparatus 36 has a laser diode 46, which is a semiconductor laser as a recording light source, energizable by a laser driver 44 for outputting a light signal L, as a laser beam (also referred to as light beam) for recording an image on a photosensitive medium 32. The optically scanned image recording apparatus 36 also has a synchronizing light source 50, which is a laser diode, energizable by a laser driver 48 for outputting a synchronizing light signal S for generating a pixel clock signal used when the light signal L scans the photosensitive medium 32 in the main scanning direction.

The optically scanned image recording apparatus 36 includes a resonant scanner (light deflecting means) 58, a scanning lens 59, and reflecting mirrors 60, 62 which are successively disposed in the light path of the light beam L that is outputted from the laser diode 46.

The laser driver 44 and the laser diode 46 also function as a light signal intensity modulating means for turning on and off the light signal L depending on the image to be recorded on the photosensitive medium 32 and controlling the intensity of the light signal L when it is turned on.

Figure 6A:
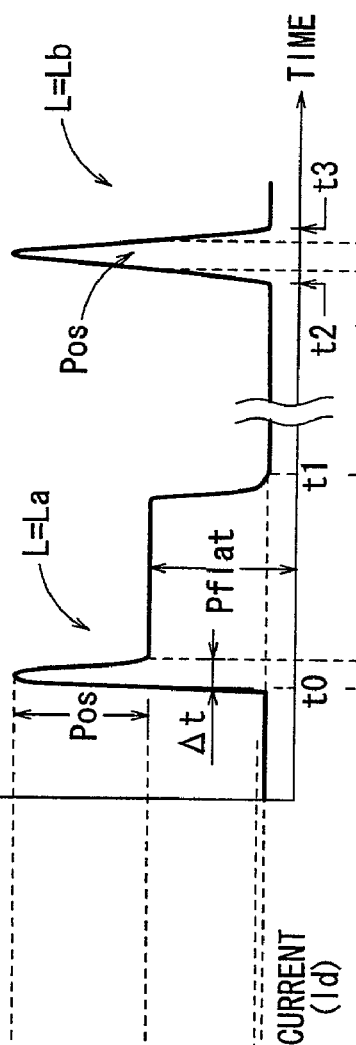
FIG. 6A is a diagram showing the current vs. laser output characteristics of a laser diode of the apparatus shown in FIG. 5.

FIG. 6A shows a current vs. laser output characteristic curve (also referred to as laser output characteristic curve) 108 of the laser diode 46. As well known in the art, the laser output characteristic curve 108 comprises a characteristic curve 108a in a bias range and a characteristic curve 108b in a laser oscillation range. In FIG. 6A, the horizontal axis represents the current supplied to the laser diode 46 and the vertical axis the laser output (laser power) generated from the laser diode 46. For an easier understanding of the present invention, a current (bias current) supplied up to a certain point in the bias range is referred to as a current Ibias, and a drive current from the point in the bias range to a certain point in the laser oscillation range is referred to as an image signal Isi.

Image information for recording an image on the photosensitive medium 32 is read from an image memory 68 shown in FIG. 5, and converted by an exposure signal controller 70 into an image signal Is as a voltage signal representing an on/off modulated signal (a pulse-width-modulated signal having a constant amplitude), which is supplied to the laser driver 44.

Figure 7:
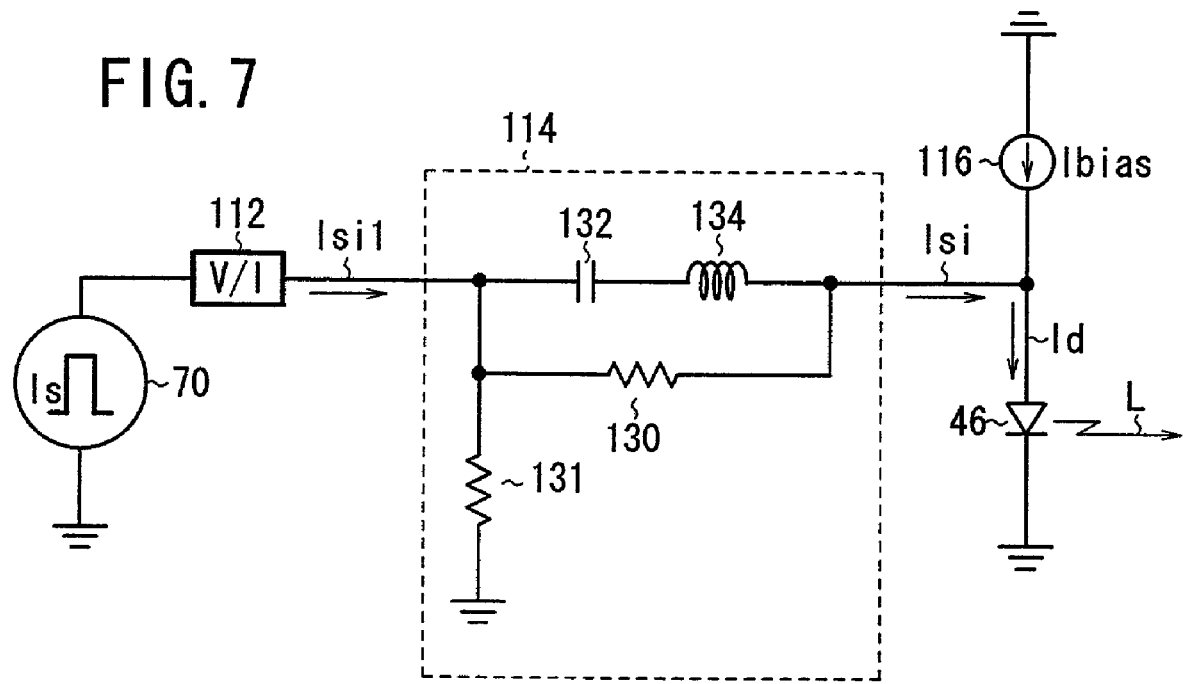
FIG. 7 is a circuit diagram of an overshoot producing circuit as an example which is connected when the laser diode is used.

FIG. 7 shows a basic equivalent circuit of the laser driver 44. In the laser driver 44, the image signal Is outputted as a voltage signal from the exposure signal controller 70 which functions as an image signal source is converted into an image signal Isi1 as a current signal by a voltage-to-current converter (V/I converter) 112.

The image signal Isi1 outputted from the voltage-to-current converter 112 is supplied to an overshoot producing circuit 114 as an overshoot producing means which comprises a waveform adjusting circuit (waveform shaping circuit). The overshoot producing circuit 114 divides the image signal Isi1 into a signal supplied to a resistor 131 and a signal supplied as an image signal Isi to the laser diode 46.

To the laser diode 46, there is also applied a bias current Ibias (see also FIG. 6A) as a direct current from a bias current source 116.

Therefore, an image signal (also referred to as a laser drive current) Id (Id=Ibias+Isi) which is the combination of the bias current Ibias as a direct current and an image signal Isi as an alternating current is supplied to the laser diode 46.

The bias current Ibias may be added to the image signal Is by the exposure signal controller 70 and hence applied to the voltage-to-current converter 112.

The overshoot producing circuit 114 comprises a shunt resistor 131 and an LCR circuit which comprises a series-connected circuit of a capacitor 132 and an inductor 134 and a resistor 130 connected parallel to the series-connected circuit. Each of these elements of the overshoot producing circuit 114 may be of the variable type for adjusting the amplitude and width $\Delta t$ of an overshoot Pos which will be described later on. The overshoot producing circuit 114 may be software-implemented on the image signal which is outputted from the image memory 68. In the present embodiment, the overshoot producing circuit 114 is hardware-implemented as shown in FIG. 7.

Figure 6B:
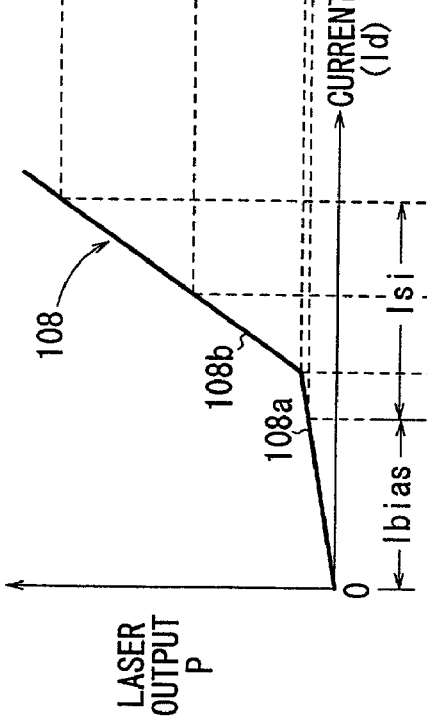
FIG. 6B is a diagram showing the waveform of an image signal as a current signal with an overshoot which is supplied to the laser diode.

FIG. 6B shows, by way of example, the waveform of an image signal Is (indicated by the dotted-line curve) as a current signal corresponding to the image signal Is as a voltage signal and the waveform of an image signal Isi (indicated by the solid-line curve) with an overshoot produced by the overshoot producing circuit 114. In FIG. 6B, the vertical axis represents time and the horizontal axis the current.

Figure 6C:
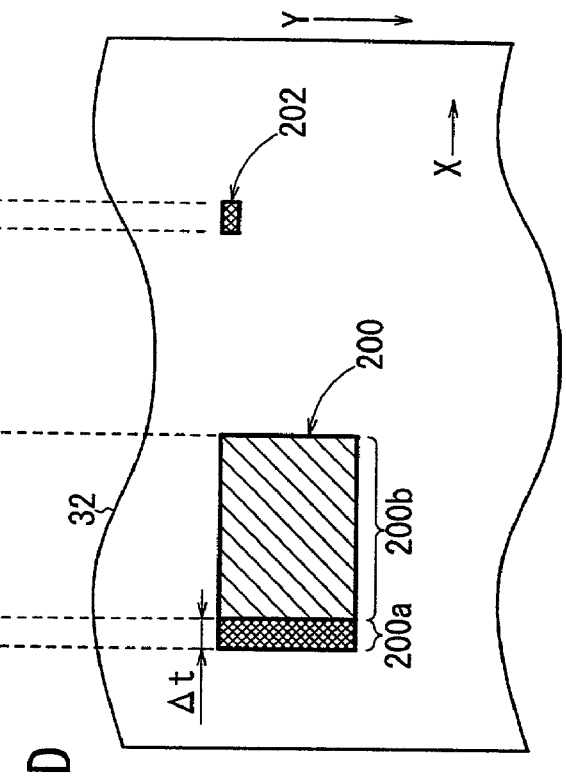
FIG. 6C is a diagram showing the waveform of a light signal with an overshoot which is generated by the laser diode that is energized by the current signal with the overshoot.

FIG. 6C shows the waveform of a light signal L which is the waveform of the laser output P produced by the laser diode 46 when the laser current (image signal) Id (Id=Ibias+Isi) with the overshoot Pos is supplied to the laser diode 46. In FIG. 6C, the horizontal axis represents time and the vertical axis the laser output P.

The waveform of the light signal L includes the overshoot Pos on a positive-going edge after a time to in FIG. 6C. The overshoot Pos has an amplitude which is at least 0.4 times the amplitude of a flat portion Pflat of the light signal L $\{0.4 \leq (Pos/Pflat)\}$. The amplitude and width (time duration) $\Delta t$ of the overshoot Pos of the light signal L can be optimized by varying the values of the capacitor 132, the inductor 134, and the resistors 130, 131 of the overshoot producing circuit 114. The width $\Delta t$ of the overshoot Pos may be defined as the width of the overshoot Pos in the middle of its amplitude for clarification.

Depending on the image signal Is, the light signal L which includes the overshoot formed on its positive-going edge (in FIG. 6C, the light signal L is composed of an ON portion where L=La, L=Lb and an OFF portion where L=Lbias) is supplied to a resonance scanner 58 shown in FIG. 5.

The resonant scanner 58 oscillates a mirror at a high speed with a drive signal supplied from a scanner driver 74, and deflects the light signal L from the laser diode 46 in the main scanning direction X for supplying the deflected light beam L to a scanning lens 59. The light signal L that has passed through the scanning lens 59 is adjusted in its scanning speed with respect to the main scanning direction X, and is then reflected by the reflecting mirrors 60, 62 toward the photosensitive medium 32.

A reflecting mirror 78 movable into and out of the light path of the light signal L by a displacing unit 76 is disposed between the reflecting mirror 62 and the photosensitive medium 32. When the reflecting mirror 78 is positioned in the light path of the light signal L, it reflects the light signal L to a photosensor 80 for monitoring an amount of light of the light signal L. The photosensor 80 detects an amount of light of the light signal L, which is converted by an A/D converter 82 into a digital signal that is supplied to the exposure signal controller 70.

The resonant scanner 58, the scanning lens 59, the reflecting mirror 60, a reflecting mirror 84, a reference grating 86, a light guide rod 88, and photosensors 90a, 90b are successively disposed in the light path of the synchronizing light signal S that is outputted from the synchronizing light source 50.

The synchronizing light source 50 is positioned to apply the synchronizing light signal S to the resonant scanner 58 at an angle different from the light signal L. The synchronizing light signal S is reflected and deflected by the resonant scanner 58. The synchronizing light signal S deflected by the resonant scanner 58 travels through the scanning lens 59 to the reflecting mirror 60. The synchronizing light signal S is reflected by the reflecting mirror 60 toward the reflecting mirror 84, which reflects the synchronizing light signal S toward the reference grating 86. The synchronizing light signal S passes through the reference grating 86.

The reference grating 86 is elongate in the main scanning direction X, and has a linear succession of slits along its longitudinal direction, the number of the slits depending on the resolution.

The light guide rod 88, which is substantially cylindrical in shape, is disposed behind the reference grating 86 to receive the synchronizing light signal S that has passed through the reference grating 86. The light guide rod 88 is made of a material capable of transmitting light therethrough. The synchronizing light signal S that has entered the light guide rod 88 is repeatedly reflected therein and travels therethrough to the photosensors 90a, 90b which are disposed on the respective ends of the light guide rod 88.

To the photosensors 90a, 90b, there is connected a grating clock generator 94 for generating a grating clock signal GCLK comprising as many clock pulses as the number of the slits 92 of the reference grating 86 in each main scanning cycle. The grating clock signal GCLK generated by the grating clock generator 94 is supplied, as a recording timing signal for the image data to be recorded with respect to the main scanning direction X, to the exposure signal controller 70.

The photosensitive medium 32 is positioned on and held by the exposure stage 40, which can be fed in the auxiliary scanning direction Y by a ball screw 100 that is rotatable about its own axis by an auxiliary scanning motor 98. The auxiliary scanning motor 98 is energizable by an auxiliary scanning motor driver 104 based on a motor driving reference clock signal that is supplied from an auxiliary scanning motor driving clock generator 102. The motor driving reference clock signal is generated by the auxiliary scanning motor driving clock generator 102 based on a scanning clock signal SCAN which is a main scanning start timing signal supplied from the scanner driver 74.

The printing plate producing system 30 is basically constructed as described above. Operation of the printing plate producing system 30 will now be described below with reference to FIG. 1.

When the printing plate producing system 30 is turned on, the scanner driver 74 supplies a drive signal to the resonant scanner 58 to start oscillating its mirror at a high speed.

The laser driver 48 supplies a drive signal to the synchronizing light source 50, which outputs a synchronizing light signal S. The synchronizing light signal S outputted from the synchronizing light source 50 is reflected and deflected by the resonant scanner 58, and guided by the scanning lens 59 and the reflecting mirrors 60, 84 to the reference grating 86.

The synchronizing light signal S applied to the reference grating 86 successively passes through the slits as the synchronizing light signal S moves along the reference grating 86 in the main scanning direction X, and enters as a pulsed light signal into the light guide rod 88. The pulsed synchronizing light signal S is repeatedly reflected in the light guide rod 88 and travels therethrough to the photosensors 90a, 90b on the respective ends of the light guide rod 88. The photosensors 90a, 90b convert the pulsed synchronizing light signal S into an electric signal and supplies the electric signal to the grating clock generator 94.

The grating clock generator 94 shapes the waveform of the electric signal to generate a grating clock signal GCLK. The grating clock signal GCLK generated by the grating clock generator 94 is supplied to the exposure signal controller 70.

The exposure signal controller 70 converts image information read from the image memory 68 into an on/off modulated signal according to the supplied grating clock signal GCLK and a clock signal whose frequency is a multiple of the frequency of the grating clock signal GCLK, and supplies the on/off modulated signal as the image signal Is (see the dotted-line waveform in FIG. 6B) to the laser driver 44.

The laser diode 46 outputs a light signal L (La, Lb, etc.) having the waveform shown in FIG. 6C to the resonant scanner 58. The resonant scanner 58 reflects and deflects the light signal L, which is guided by the scanning lens 59 and the reflecting mirrors 60, 62 to the photosensitive medium 32.

The scanner driver 74 also supplies a scanning clock signal SCAN generated in each main scanning cycle to the auxiliary scanning motor driving clock generator 102. Based on the supplied scanning clock signal SCAN, the auxiliary scanning motor driving clock generator 102 generates and supplies a motor driving reference clock signal to the auxiliary scanning motor driver 104. Based on the supplied motor driving reference clock signal, the auxiliary scanning motor driver 104 generates a drive signal and applies the drive signal to energize the auxiliary scanning motor 98, which rotates the ball screw 100 about its own axis. The exposure stage 40 is now displaced in the auxiliary scanning direction Y in synchronism with the scanning clock signal SCAN.

Therefore, the light signal L modulated with the image information is applied to the photosensitive medium 32 in the main scanning direction X while the photosensitive medium 32 is being fed in the auxiliary scanning direction Y, thereby forming a two-dimensional image on the printing plate 32 by way of area gradation.

Figure 6D:
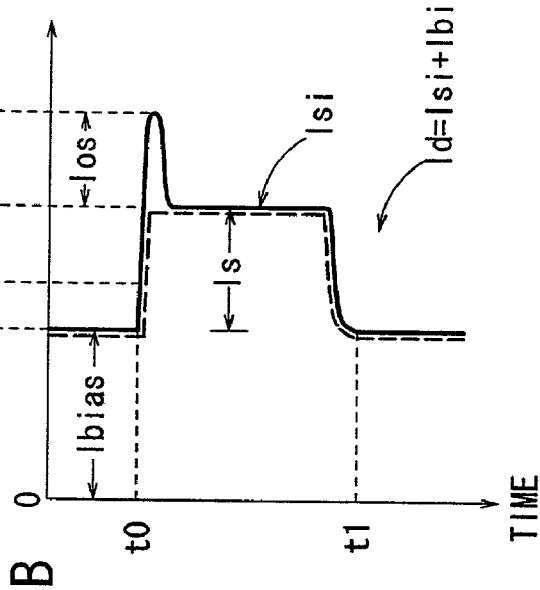
FIG. 6D is a view of images formed on a photosensitive medium by the light signal.

FIG. 6D schematically shows by way of example halftone dot images 200, 202 formed on the photosensitive medium 32.

The halftone dot image 200 is recorded on the photosensitive medium 32 by the light signal L (indicated by La) having the overshoot Pos which is generated in a time duration between times t0, t1. Since the amount of light applied to an image portion 200a of the halftone dot image 200 which corresponds to the time duration $\Delta t$ of the overshoot Pos is increased, the plate wear resistance of the image portion 200a is increased. An image portion 200b of the halftone dot image 200 which is recorded by the flat portion of the light signal is not overly exposed to light, and hence does not suffer image irregularities in a screen tint image, halftone dot edge blurs, or increases in the width of thin lines. Therefore, the halftone dot image 200 which is an image other than a highlight halftone dot image does not have its image quality lowered.

The halftone dot image 202 is formed on the photosensitive medium 32 by the light signal L (indicated by Lb) having the overshoot Pos generated in a time duration between times t2, t3 has been produced by exposure to an increased amount of light, and hence has a sufficient level of plate wear resistance in highlight images.

In the highlight image (halftone dot image) 202, the time duration $\Delta t$ of the overshoot Pos is sufficient if it corresponds to a range from one pixel to several pixels, or a range from about 10 µm to 60 µm in terms of the length of the image formed in the main scanning direction X on the photosensitive medium 32.

As described above, the light signal L having the overshoot Pos over the time duration $\Delta t$ can be used to appropriately expose the photosensitive medium 32 which has, on the support base 20, the photosensitive layer 21 where an area exposed to light is turned into and remains as an image, making it possible to form the image 202 with an increased level of plate wear resistance at highlight halftone dots.

Figure 8:
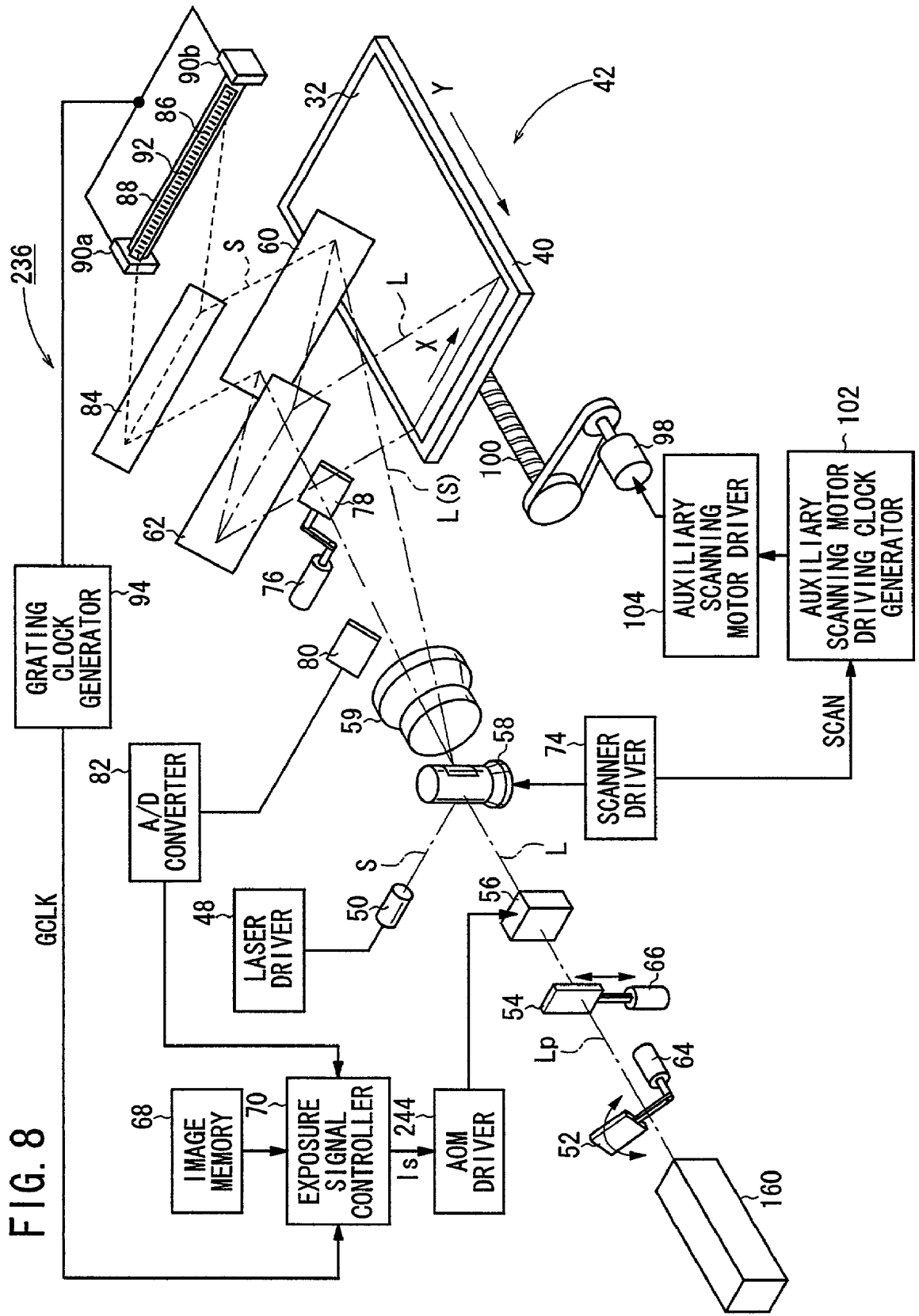
FIG. 8 is a schematic perspective view, partly in block form, of an apparatus for recording an optically scanned image of another embodiment according to the present invention.

FIG. 8 shows in perspective, partly in block form, an apparatus 236 for recording an optically scanned image of another embodiment according to the present invention. The optically scanned image recording apparatus 236 shown in FIG. 8 differs from the optically scanned image recording apparatus 36 shown in FIG. 5 in that the laser diode 46 is replaced with a gas laser unit 160 which requires an AOM (acousto-optical modulator) 56, for example. A solid-state laser such as an SHG laser or the like may be used instead of the gas laser unit 160, and an electro-optical modulator (EOM) may be used instead of the AOM 56.

In the optically scanned image recording apparatus 236 shown in FIG. 8, a mechanical shutter 52 and a variable-transmittance ND filter 54 are interposed between the gas laser unit 160 and the AOM 56. The laser driver 44 shown in FIG. 5 is replaced with an AOM driver 244 in FIG. 8.

Figure 9:
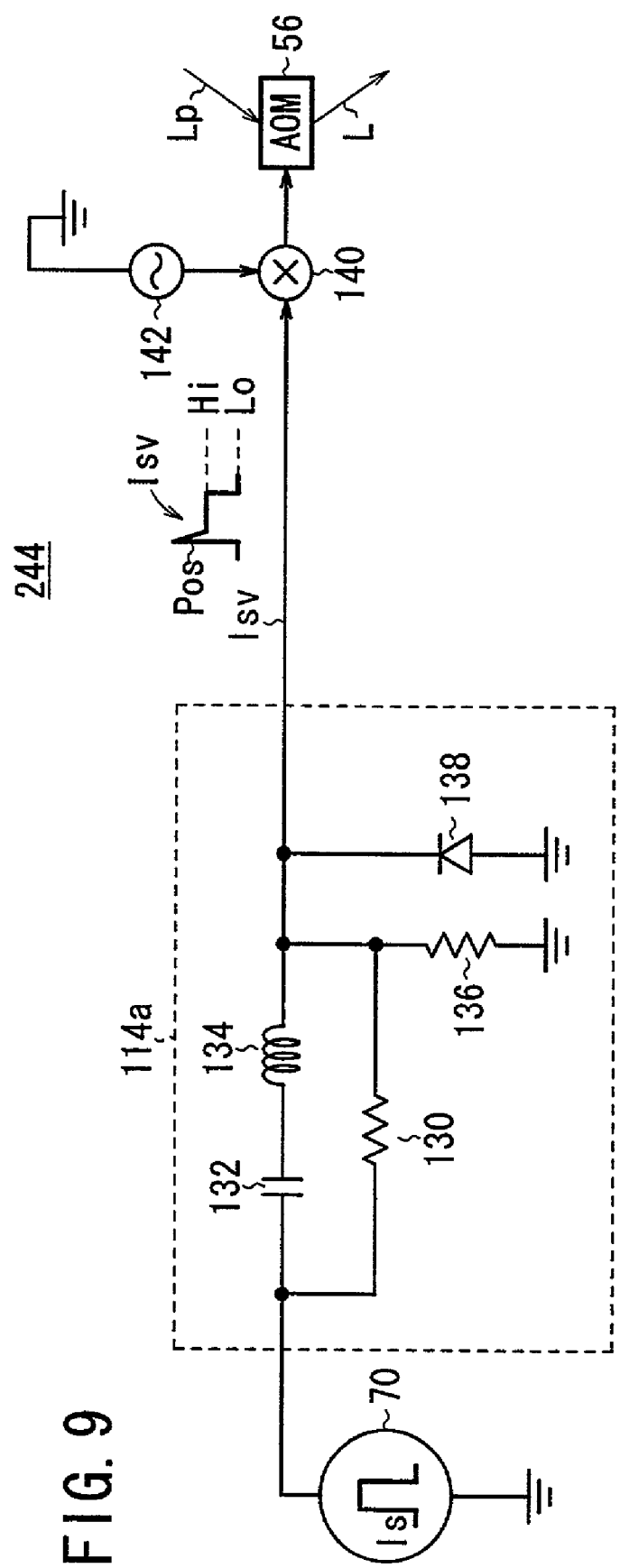
FIG. 9 is a circuit diagram of an overshoot producing circuit as an example which is connected when an acousto-optical modulator is used.

FIG. 9 shows the AOM driver 244 in detail.

Other structural details of the optically scanned image recording apparatus 236 shown in FIG. 8 are identical to those of the optically scanned image recording apparatus 36 shown in FIG. 5, and will not be described in detail below.

The mechanical shutter 52 is movable into and out of the light path of a light beam Lp by a displacing unit 64 for selectively supplying and blocking the light beam Lp to the photosensitive medium 32. The variable-transmittance ND filter 54 is positionally variable with respect to the light path of the light beam Lp by a displacing unit 66, for controlling the amount of light of the light beam Lp.

The AOM 56, which functions as a light beam intensity modulating means, turns on and off the light signal L depending on an image to be recorded on the photosensitive medium 32. Image information for recording an image on the photosensitive medium 32 are read from an image memory 68, and converted into an image signal Is which is an on/off modulation signal by an exposure signal controller 70. The image signal Is is then converted into a voltage signal Isv having an overshoot Pos by an overshoot producing circuit 114a. The voltage signal Isv is combined with a signal having a given frequency from a signal generator 142 by a mixer 140 which comprises a multiplier. The combined signal is then supplied from the mixer 140 to the AOM 56.

A resistor 136 of the overshoot producing circuit 114a functions as a damper, and a diode 138 thereof operates to prevent the input signal to the mixer 140 from becoming negative in level.

The voltage signal Isv whose waveform is shown at the input terminal of the mixer 140 in FIG. 9 has a low level Lo which is substantially a zero volt. When the low level of the voltage signal Isv is combined with the signal from the signal generator 142 by the mixer 140, the mixer 140 outputs a signal of substantially zero value. At this time, the AOM does not produce the light signal L which is represented by first-order diffracted light of high light intensity.

At a high level Hi, the voltage signal Isv including the overshoot Pos is modulated by the signal from the signal generator 142, enabling the AOM 56 to produce the light signal L which is represented by first-order diffracted light. Since the intensity of this light signal L depends on the level of the voltage signal Isv, the portion of the light signal L which corresponds to the overshoot Pos is of a higher value than the portion thereof which corresponds to the high level Hi of the flat portion of the light signal L.

The light beam Lp emitted from the gas laser unit 160 is turned on and off by the AOM 56 depending on the image information. At a positive-going edge when the light beam Lp is turned on, it is converted into the light signal L having the overshoot by the AOM 56, and then supplied to the resonant scanner 58. Other operational details of the optically scanned image recording apparatus 236 shown in FIG. 8 are identical to those of the optically scanned image recording apparatus 36 shown in FIG. 5, and will not be described in detail below.

The principles of the present invention are also applicable to an external-surface optically scanned image recording apparatus in which a photosensitive medium held on the outer circumferential surface of a rotating drum is scanned in a main scanning direction by a light signal emitted from a recording light source and is also scanned in an auxiliary scanning direction by moving the recording light source along the axis of the drum, for thereby recording a two-dimensional image on the entire surface of the photosensitive medium.

The principles of the present invention are further applicable to an internal-surface optically scanned image recording apparatus in which a spinner whose mirror has a reflecting surface lying at 45° to the optical axis of a light signal emitted from a recording light source to a photosensitive medium held on the inner circumferential surface of a cylindrical drum is disposed on the central axis of the cylindrical drum, and the spinner is rotated at a constant speed to scan the photosensitive medium in a main scanning direction with the light signal and is also moved in an auxiliary scanning direction along the axis of the cylindrical drum, for thereby recording a two-dimensional image on the photosensitive medium.

According to the present invention, as described above, even when a small image such as a highlight halftone dot image is recorded on a photosensitive medium, a desired image density or a desired level of plate wear resistance can be achieved by an overshoot of a light signal which is applied to scan the photosensitive medium.

If a large image is to be recorded, then since the photosensitive medium is scanned chiefly by a flat portion of the light signal after the overshoot, the image can be formed with high image quality free of image irregularities and other defects.

According to the present invention, inasmuch as an image is recorded on a photosensitive medium using a light signal with an overshoot, it is possible to achieve a desired image density or a desired level of plate wear resistance even when a small image is recorded, and also to maintain high image quality of recorded images.

Although certain preferred embodiments of the present invention have been shown and described in detail, it should be understood that various changes and modifications may be made therein without departing from the scope of the appended claims.

What is claimed is:

1. An apparatus for recording an area gradation image on a photosensitive medium by scanning the photosensitive medium with a light signal, comprising:
    overshoot producing means for generating an image signal with an overshoot on a positive-going edge of an input image signal; and
    a recording light source for outputting a light signal with an overshoot in response to the image signal with the overshoot supplied from said overshoot producing means.

2. An apparatus according to claim 1, wherein said photosensitive medium comprises a support base and a photosensitive layer disposed on said support base and having an area capable of being turned into an image upon exposure to the light signal.

3. An apparatus according to claim 1, wherein said photosensitive medium comprises a printing plate.

4. An apparatus according to claim 1, wherein said recording light source comprises a semiconductor laser.

5. An apparatus according to claim 1, wherein said overshoot has an amplitude which is at least 0.4 times the amplitude of a flat portion of said light signal.

6. An apparatus according to claim 1, wherein said overshoot is produced in a time duration which corresponds to a range from 10 µm to 60 µm in terms of the length of the image in a scanning direction on said photosensitive medium.

7. An apparatus according to claim 1, wherein said overshoot is produced in a time duration which corresponds to a range from one to six pixels in terms of the number of pixels in a scanning direction on said photosensitive medium.

8. A method of recording an area gradation image on a photosensitive medium by scanning the photosensitive medium with a light signal, comprising the steps of:
   generating an image signal with an overshoot on a positive-going edge of an input image signal with an overshoot producing means; and
   outputting a light signal with an overshoot from a recording light source in response to the image signal with the overshoot supplied from said overshoot producing means.

9. A method according to claim 8, wherein said photosensitive medium comprises a support base and a photosensitive layer disposed on said support base and having an area capable of being turned into an image upon exposure to the light signal.

10. A method according to claim 8, wherein said photosensitive medium comprises a printing plate.

11. A method according to claim 8, wherein said recording light source comprises a semiconductor laser.

12. A method according to claim 8, wherein said overshoot has an amplitude which is at least 0.4 times the amplitude of a flat portion of said light signal.

13. A method according to claim 8, wherein said overshoot is produced in a time duration which corresponds to a range from 10 µm to 60 µm in terms of the length of the image in a scanning direction on said photosensitive medium.

14. A method according to claim 8, wherein said overshoot is produced in a time duration which corresponds to a range from one to six pixels in terms of the number of pixels in a scanning direction on said photosensitive medium.

15. An apparatus according to claim 1, wherein said image signal comprises a combination of a direct current and an alternating current.

16. A method according to claim 8, wherein said image signal comprises a combination of a direct current and an alternating current.

17. An apparatus according to claim 15, wherein said alternating current is divided by said overshoot producing means prior to being combined with said direct current.

18. A method according to claim 16, wherein said alternating current is divided by said overshoot producing means prior to being combined with said direct current.

* * * * *